United States Patent [19]

Yamada et al.

[11] Patent Number: 5,598,611
[45] Date of Patent: Feb. 4, 1997

[54] CLIP AND CLIP STRUCTURE

[75] Inventors: Atsushi Yamada, Toyota; Tetsuya Kaneko, Yokohama, both of Japan

[73] Assignee: Nifco Inc., Yokohama, Japan

[21] Appl. No.: 539,790

[22] Filed: Oct. 5, 1995

[30] Foreign Application Priority Data

Oct. 7, 1994 [JP] Japan .................... 6-270443

[51] Int. Cl.$^6$ .................................. A44B 11/25
[52] U.S. Cl. .................. 24/573.1; 24/67.11; 24/492; 24/515; 24/543; 24/295
[58] Field of Search ............... 24/67.11, 492, 24/515, 543, 295, 573.1

[56] References Cited

U.S. PATENT DOCUMENTS

| | | | |
|---|---|---|---|
| 2,598,776 | 6/1952 | Flora | 24/295 |
| 2,959,259 | 11/1960 | Meyer | 24/295 X |
| 3,970,346 | 7/1976 | Kretschmer | 24/295 X |
| 4,092,766 | 6/1978 | Meyer | 24/295 |
| 4,218,099 | 8/1980 | Bayman et al. | 24/295 X |
| 4,710,852 | 12/1987 | Keen | 24/295 X |
| 5,101,540 | 4/1992 | Roof et al. | 24/295 X |
| 5,186,517 | 2/1993 | Gilmore et al. | 24/295 X |
| 5,367,751 | 11/1994 | DeWitt | 24/295 |

Primary Examiner—Peter R. Brown
Assistant Examiner—Stephen Vu
Attorney, Agent, or Firm—Oblon, Spivak, McClelland, Maier & Neustadt, P.C.

[57] ABSTRACT

A clip includes a resilient tongue at one end thereof, a resilient engaging portion at another end thereof, an engaging portion formed on the resilient tongue for engagement with a support member of an attachment article, and a stop member provided on the support member to suppress flexing by the resilient engaging portion when the engaging portion of the resilient tongue is in engagement with the support member. The engaging portion is in contact with the stop member when the engaging portion of the resilient tongue is in engagement with the support member. Flexing of the resilient engaging portion is enabled by releasing the engagement of the engaging portion of the resilient tongue and moving the clip.

2 Claims, 10 Drawing Sheets

CLIP AND CLIP STRUCTURE

BACKGROUND OF THE INVENTION

1. Field of the Invention

The present invention relates to a clip and clip structure for attaching two articles together, and particularly to a clip and clip structure for attaching one article to another, and allows articles thus attached to be readily disengaged a multiplicity of times without loss of the original clip function.

2. Description of the Prior Art

JP-B-HEI-6-24253 discloses an example of a structure used to readily attach two articles together, such as by providing one of the articles with a clip, spring or other such means for engagement with a part of the other article, and moving either one of the articles to effect engagement with the other article. FIG. 22 illustrates an arrangement used in JP-B-HEI-6-24253 to attach a ventilator grill 100 to an instrument panel 102. Strip-shaped retaining springs 101 are attached on the outside of the ventilator grill 100 so that the free end of each spring is in the opening 100' of the ventilator grill 100. The free ends of the springs 101 are bent to project through towards the inside of the ventilator grill 100 via holes 100" provided in the grill 100. Each engaging portion 101b on the outside of the ventilator grill 100 engages with the edge of a grill fixing hole 102a. In this arrangement, the ventilator grill 100 is inserted into the instrument panel 102 via the fixing hole 102a, with the grill opening 100' facing outward from the instrument panel 102. This brings the inside surface of the fixing hole 102a into contact with the outside of the retaining springs 101, flexing the springs 101 inwards until the springs 101 can spring back out into engagement with the edge of the fixing hole 102a, thereby fixing the ventilator grill 100 to the instrument panel 102.

FIG. 23 shows a fixing device disclosed by JP-A-HEI-6-51513 to affix an article 201 to a panel 202. A clip 200 has a hook-shaped portion 200a that snaps into engagement in an opening 20b formed in a fixing portion 201a on the article 201, and abutment portions 200b the ends of which are curved outward. When the clip 200 is in place on the article 201, inserting the article 201 into the fixing hole 202a in the panel 202, causes the ends of the abutment portions 200b to snap into engagement with the edge of the fixing hole 202a.

To remove a ventilator grill 100 that has been thus attached, the tip of a screwdriver or other suitable tool has to be passed through the grill opening 100' to press inward a release portion 101a on the end of each spring 101 and disengage the engaging portion 101b from the edge of the fixing hole 102a, allowing the ventilator grill 100 to be pulled out. This is an operation that makes it difficult to smoothly replace a ventilator grill. One way of facilitating the operation is to reduce the distance by which each spring 101 has to be flexed inward. However, with the conventional structure there is a limitation on how much the length of that part of the spring can be reduced before adversely affecting the secure engagement with the fixing hole 102a. Moreover, repeated releasings and re-engagements can gradually deform the springs 101 towards the inside of the ventilator grill 100, reducing the length of the engaging portion 101b and therefore weakening the engagement with the fixing hole 102a. However, since the springs 101 are integrally affixed to the ventilator grill 100, it is not easy to replace springs that have become weakened.

In the fixing device of JP-A-HEI-6-51513, the clip 200 is attached to the article 201 by the hooked engaging portion 200a snapping into position in the opening 201b in the fixing portion 201a. As such, if there is a weakening of the engaging force of the free ends of the abutment portions 200b, the clip 200 can be replaced relatively easily by releasing the engagement between the hooked portion 200a and the insertion opening 201b. However, in this case too, disengaging the ends of the abutment portions 200b from the fixing hole 202a involves using the tip of a screwdriver or the like to flex the ends sufficiently inward to allow the fixing portion 201a of the article 201 in the clip 200 to be withdrawn from the fixing hole 202a in the panel 202, and this therefore is not an easy task. Furthermore, since there has to be sufficient outward projection of the abutment portions 200b to ensure a secure engagement in the fixing hole 202a of the panel 202, it is difficult to reduce the amount by which the abutment portions 200b have to be flexed inwards.

SUMMARY OF THE INVENTION

An object of the present invention is to provide a clip and clip structure for attaching one article to another and allowing articles thus attached to be readily disengaged a multiplicity of times without loss of the original clip function.

In accordance with the present invention, the above object is attained by a clip, comprising a resilient tongue at one end of the clip, a resilient engaging portion at another end, an engaging portion formed on the resilient tongue for engagement with a support member of an attachment article, and a stop member provided on the support member to suppress flexing by the resilient engaging portion when the engaging portion of the resilient tongue is in engagement with the support member, wherein the engaging portion is in contact with the stop member when the engaging portion of the resilient tongue is in engagement with the support member, and flexing of the resilient engaging portion is enabled by releasing the engagement of the engaging portion of the resilient tongue and moving the clip.

The above object is also attained by a clip structure for affixing first and second articles together using a clip, comprising a clip that includes a resilient tongue at one end of the clip and a resilient engaging portion at another end of the clip, an engaging portion formed on the resilient tongue for engagement with a support member on a first article, and a stop member provided on the support member to suppress flexing by the resilient engaging portion when the engaging portion of the resilient tongue is in engagement with the support member, wherein the resilient engaging portion is engaged in an opening on a second article when flexing by the resilient engaging portion is suppressed, and disengaged while said flexing is enabled.

The object is also attained by the above clip structure, wherein the first article is provided with an opening with which the engaging portion of the resilient tongue engages.

Thus, the clip according to this invention includes a resilient tongue at one end and a resilient engaging portion at the other, and a means for enabling the resilient tongue to slip into engagement in a support member provided on one article to allow that article to be attached to another article. Also, the support member is provided with a stop member which is in contact with the resilient engaging portion when the resilient tongue is engaged with the support member, thereby preventing the resilient engaging portion from being flexed. Moreover, the lock on the flexing by the resilient engaging portion can be released by disengaging the engaging means on the tongue and moving the clip. Thus, the clip can be affixed to an article to be attached to another article by the engagement of the resilient tongue in the support member.

When the clip is thus affixed in place, the resilient engaging portion is held in contact with a stop member that prevents flexing by the resilient engaging portion. This enables the resilient engaging portion to be engaged with part of an article to which another article can then be attached. For disengagement, the resilient tongue is pressed down, releasing the engagement between the resilient tongue and the support member and thereby enabling the clip to be moved. When the clip is moved, the resilient engaging portion can be flexed for disengagement from the article.

The invention also provides a clip structure for affixing a pair of articles together, using the above clip with a resilient tongue at one end of the clip and a resilient engaging portion at the other end. Again, the resilient tongue is provided with means that allow it to be engaged with a support member on one article, and the support member has a stop member to stop the resilient engaging portion from flexing when the engaging portion of the resilient tongue is in engagement with the support member. The resilient engaging portion is inserted into engagement with an opening on the other article when flexing by the resilient engaging portion is blocked, and disengaged when the resilient engaging portion is free to flex. Thus, the clip is affixed to the article by the resilient tongue means snapping into engagement with the support member.

When the clip is thus affixed in place, the contact with the stop member prevents the resilient engaging portion from flexing. This enables the resilient tongue to be inserted into engagement with an opening on the other article, affixing the two articles together. For disengagement, the resilient tongue is pressed down, releasing the engagement between the resilient tongue and the support member and thereby enabling the clip to be moved. When the clip is moved, the resilient engaging portion can be flexed, enabling the resilient engaging portion to be withdrawn from engagement in the opening.

The above clip structure for attaching two articles together also includes an opening on the article to be attached, with which the resilient tongue engages. In this case, disengagement can be accomplished by flexing the resilient tongue via the opening. After disengagement, the disengaged state can be maintained by moving the clip until the engagement projection is contacting the article.

The above and other features of the present invention will become apparent from the following description made with reference to the drawings.

DESCRIPTION OF THE PREFERRED EMBODIMENTS

Embodiments of the clip and clip structure according to this invention will now be described with reference to the drawings.

Figure 1:
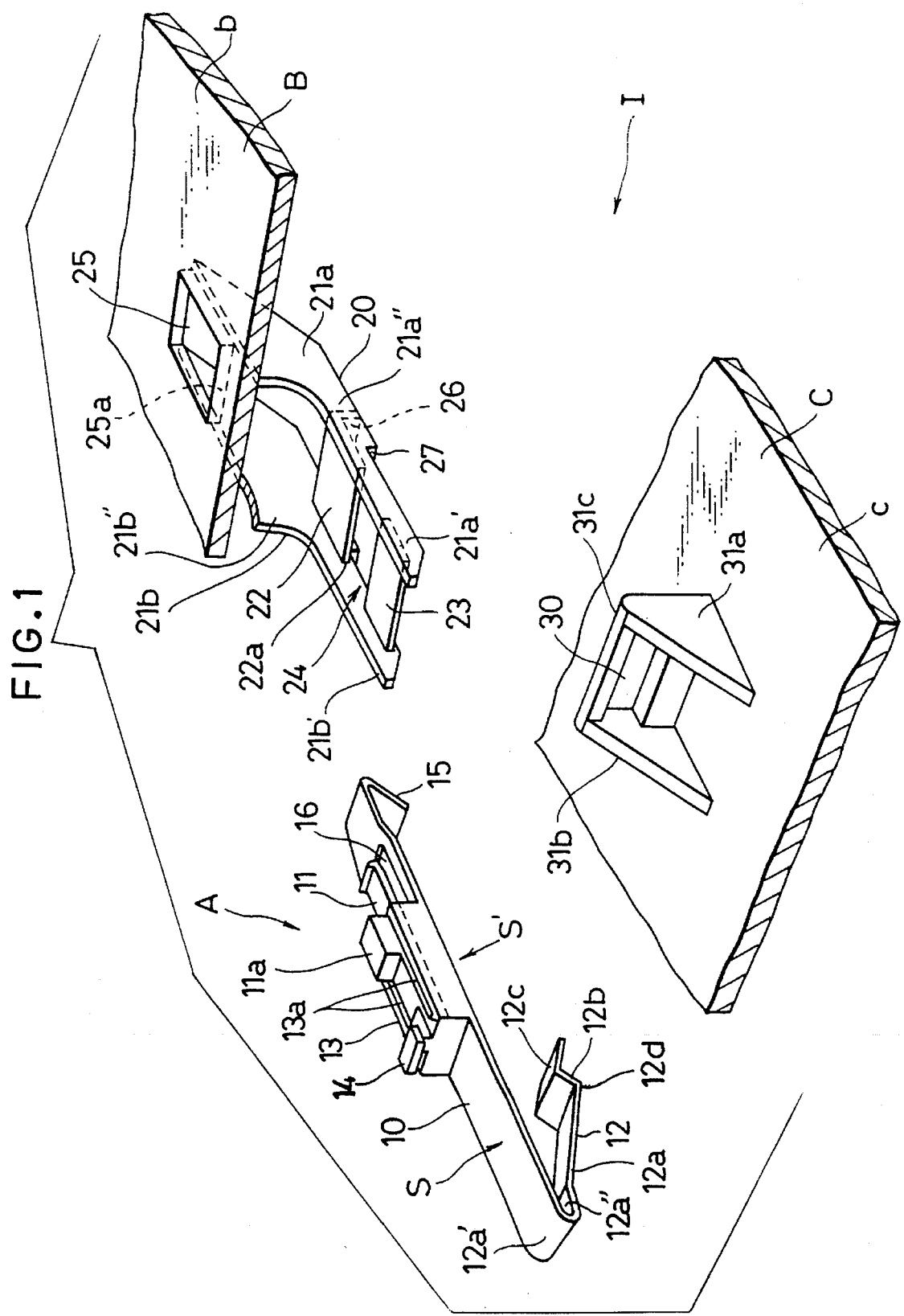
FIG. 1 is a perspective view of a clip and two articles embodying the clip structure according to an embodiment of the invention.
Figure 2:
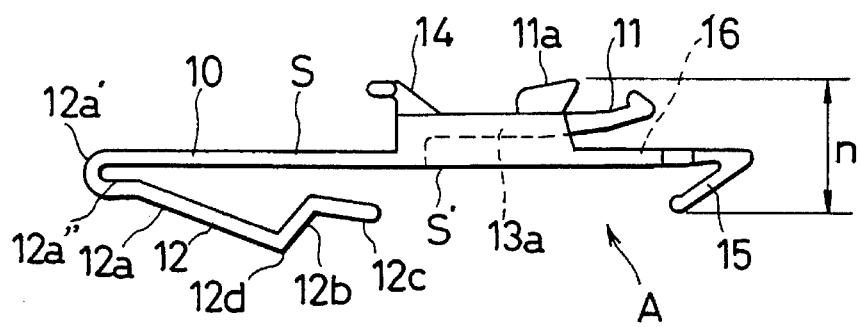
FIG. 2 is a side view of the clip of FIG. 1.
Figure 3:
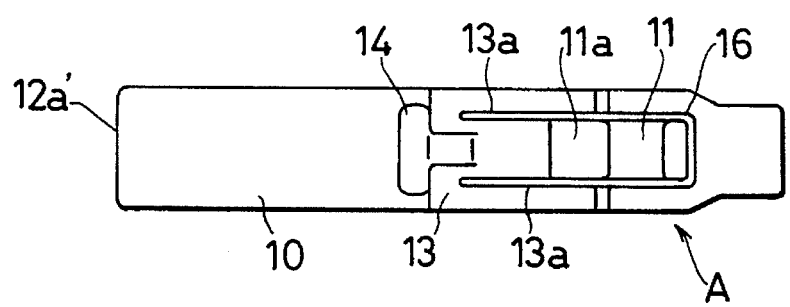
FIG. 3 is a plan view of the clip of FIG. 1.
Figure 4:
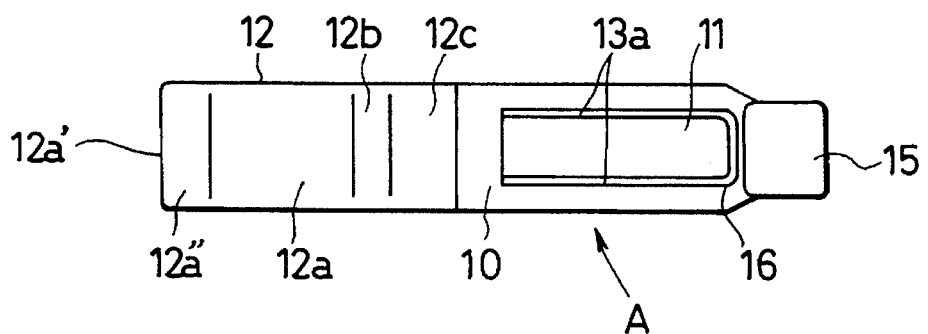
FIG. 4 is a bottom view of the clip of FIG. 1.
Figure 5:
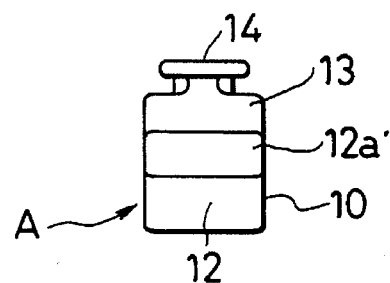
FIG. 5 is an end view of the clip of FIG. 1.
Figure 6:
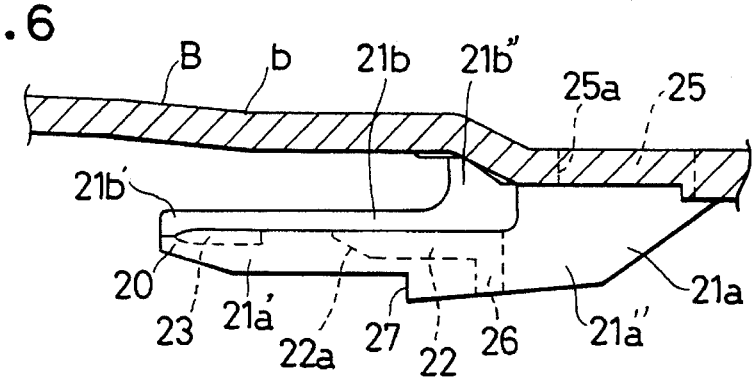
FIG. 6 is a side view of the support member of one of the two articles shown in FIG. 1.
Figure 7:
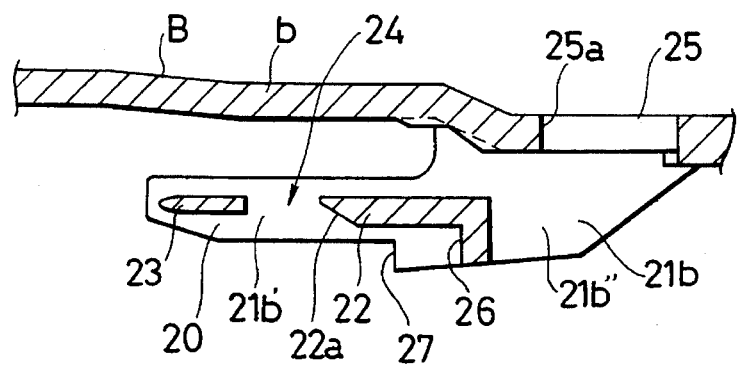
FIG. 7 is a cross-sectional side view of the support member of FIG. 6.
Figure 8:
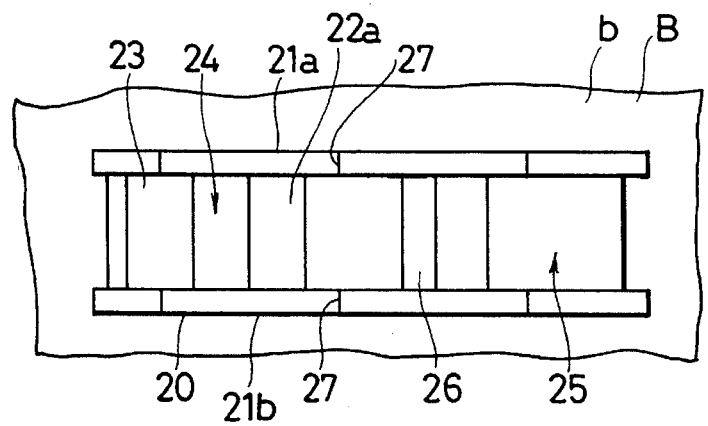
FIG. 8 is a bottom view of the support member of FIG. 6.
Figure 9:
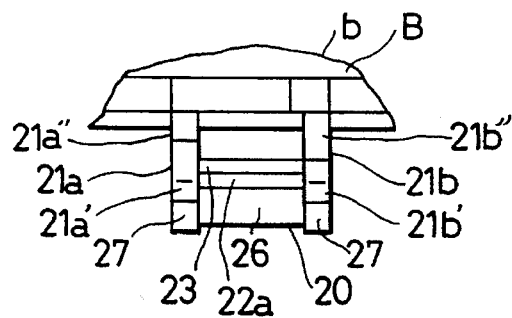
FIG. 9 is an end view of the support member of FIG. 6.
Figure 10:
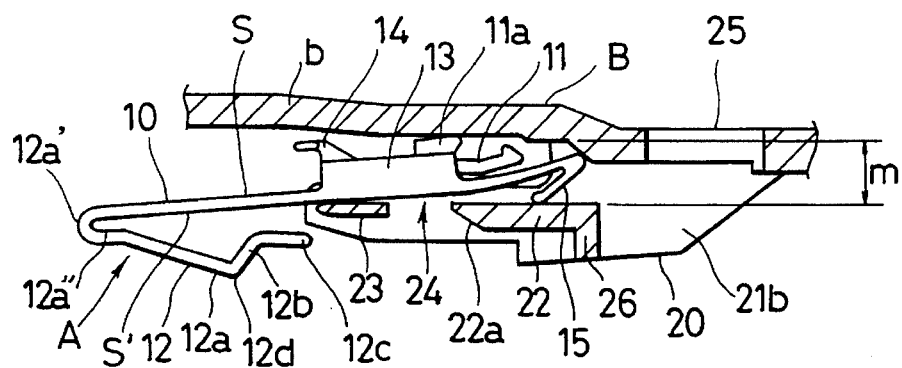
FIG. 10 is a cross-sectional side view showing use of the clip structure according to the first embodiment of the invention.

FIGS. 1 to 15 illustrate a clip A and a structure I for affixing two articles B and C together using the clip A, according to a first embodiment of the invention. In FIG. 1 the principal parts of clip A and articles B and C are shown from a perspective view to facilitate comprehension of the overall arrangement. FIG. 2 shows a side view of the clip A, FIG. 3 a plan view, FIG. 4 a bottom view and FIG. 5 an end view. FIG. 6 is a side view of a support member 20 provided on article B for clip A, FIG. 7 is a side cross-sectional view of the support member 20, FIG. 8 is a bottom view and FIG. 9 is an end view. FIG. 10 shows the clip A set partway into the support member 20 of article B, and FIGS. 11 to 15 illustrate the attachment of article B to article C by locking the clip A into the support member 20 of article B and an engagement opening 30 of article C, and the process of disengagement; that is, the use of clip structure I for the two articles B and C is shown.

Figure 16:
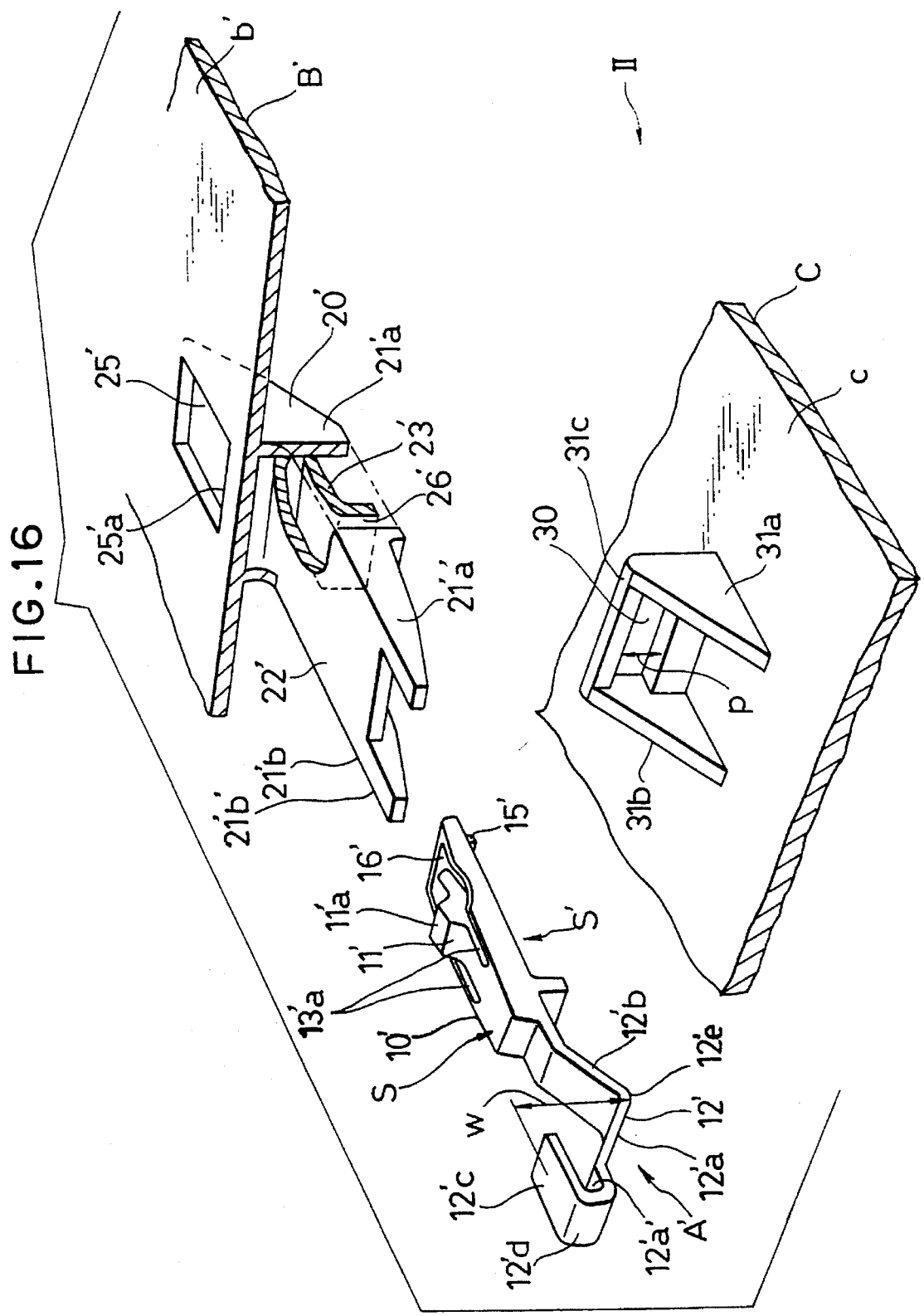
FIG. 16 is a perspective view of a clip and two articles embodying the clip structure according to another embodiment of the invention.
Figure 17:
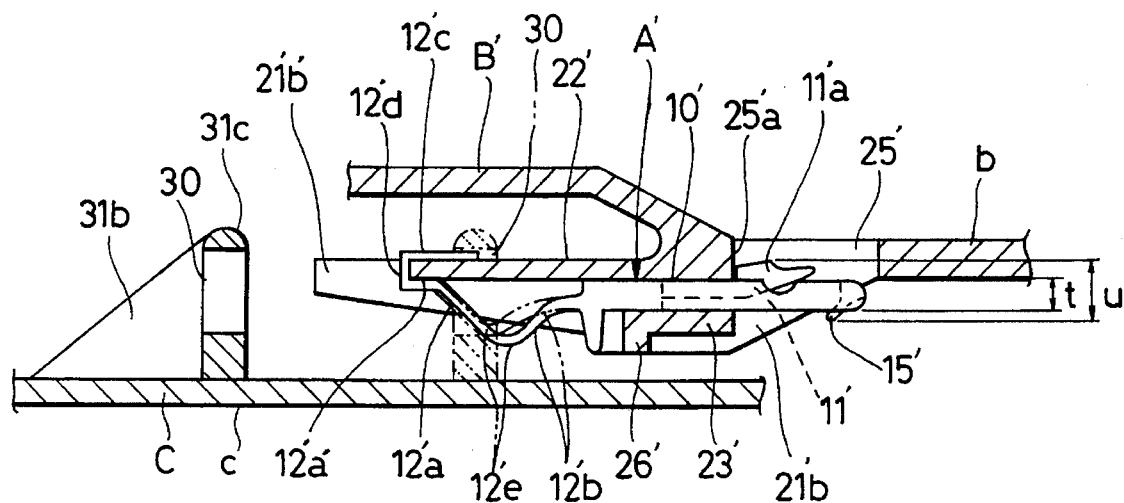
FIG. 17 is a cross-sectional side view showing use of the clip structure shown in FIG. 16.
Figure 18:
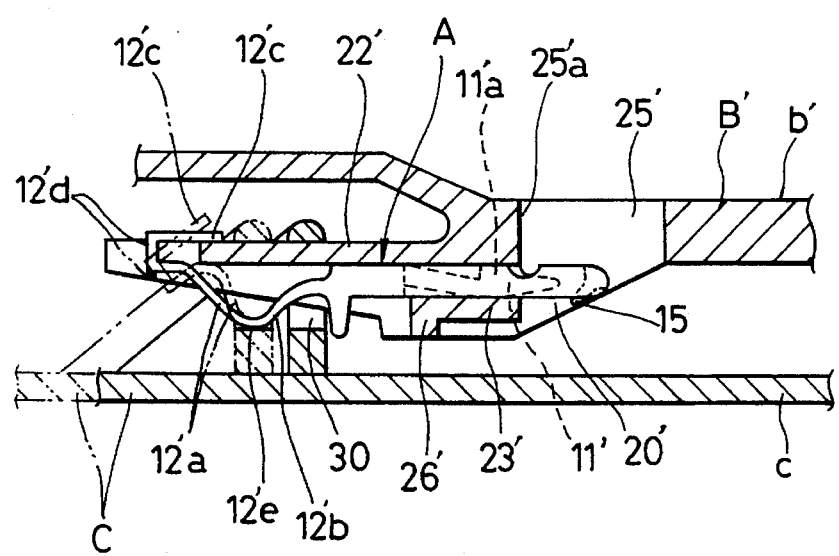
FIG. 18 is a cross-sectional side view showing use of the clip structure shown in FIG. 16.

FIGS. 16 to 18 illustrate a clip A' and a structure II for affixing two articles B' and C together using the clip A', according to a second embodiment of the invention. In FIG. 16 the principal parts of clip A' and articles B' and C are shown from a perspective view to facilitate comprehension of the overall arrangement. FIGS. 17 and 18 illustrate the attachment of article B' to article C by locking the clip A' into the support member 20 of article B' and an engagement opening 30 of article C, and the process of disengagement; that is, the use of clip structure II for the articles B' and C is shown.

Figure 19:
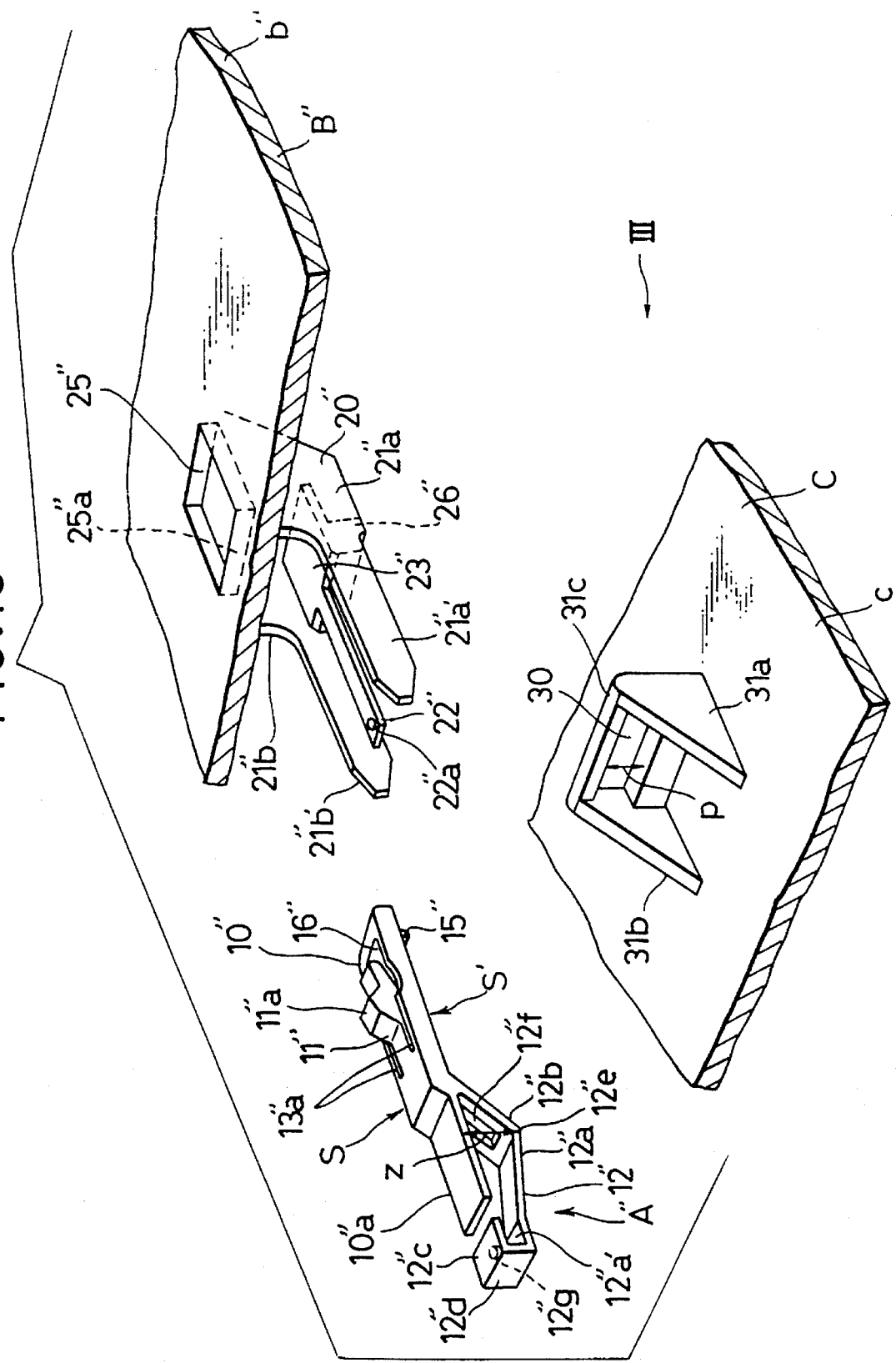
FIG. 19 is a perspective view of a clip and two articles embodying the clip structure according to another embodiment of the invention.
Figure 20:
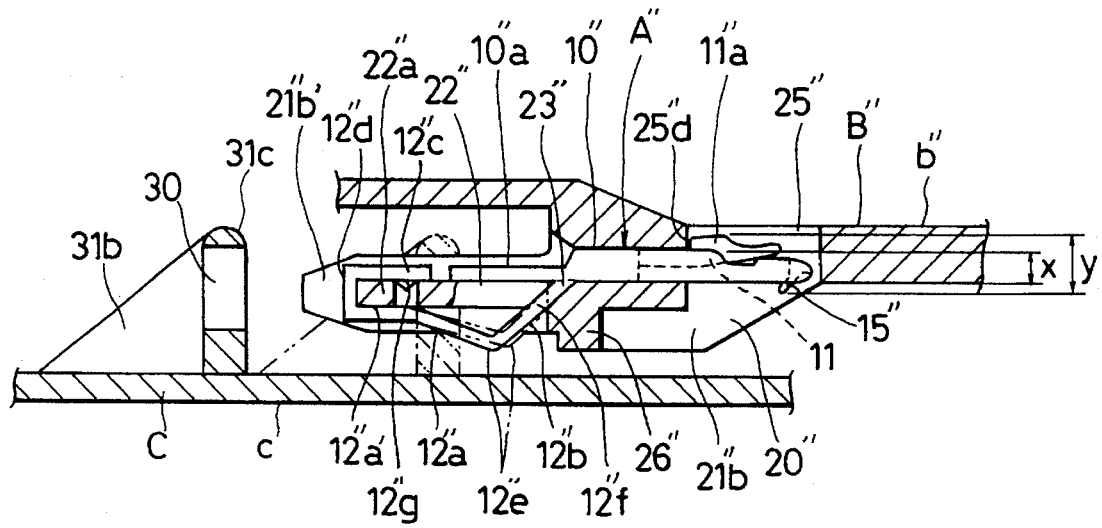
FIG. 20 is a cross-sectional side view showing use of the clip structure shown in FIG. 19.
Figure 21:
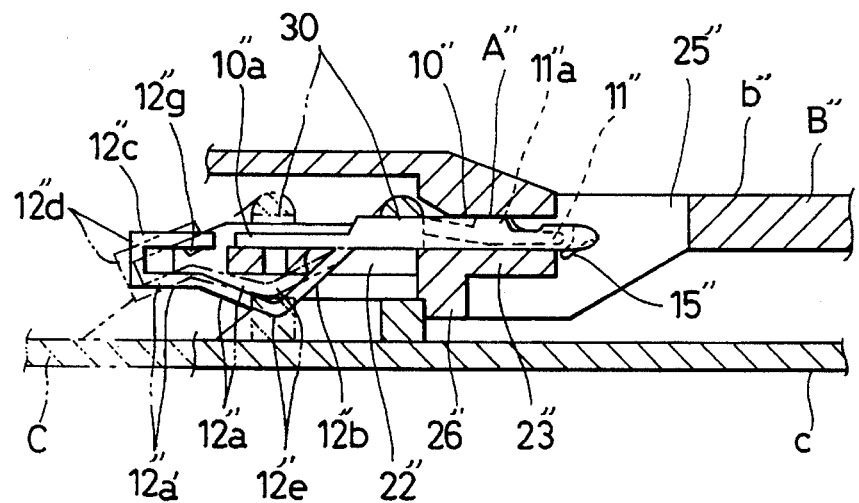
FIG. 21 is a cross-sectional side view showing use of the clip structure shown in FIG. 19.
Figure 22:
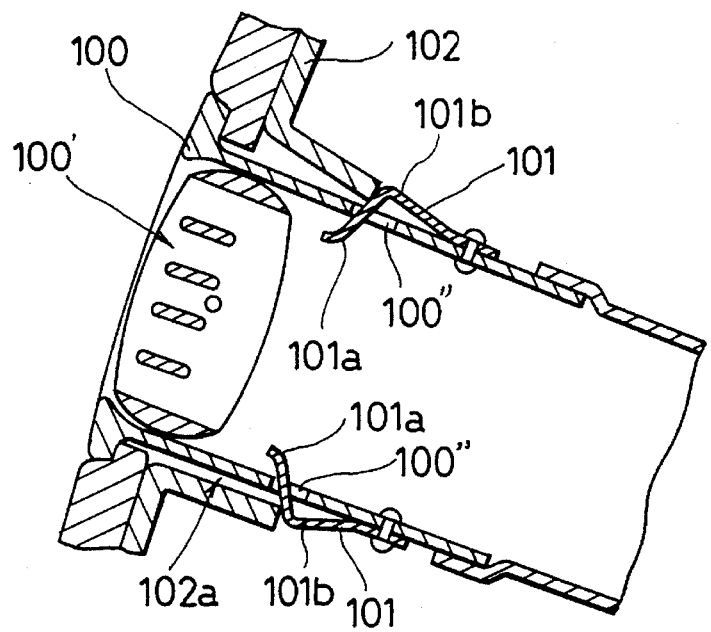
FIG. 22 is a cross-sectional view of a conventional clip structure.
Figure 23:
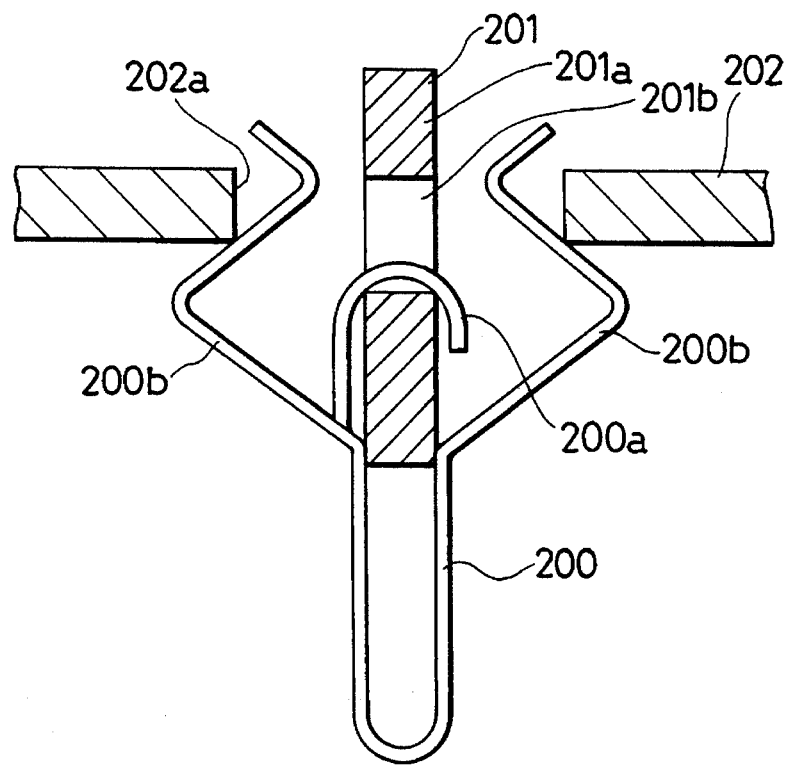
FIG. 23 is a cross-sectional view of another conventional clip structure.

FIGS. 19 to 21 illustrate a clip A" and a structure III for affixing articles B" and C together using the clip A", according to a third embodiment of the invention. In FIG. 19 the principal parts of clip A" and articles B" and C are shown from a perspective view to facilitate comprehension of the overall arrangement. FIGS. 20 and 21 illustrate the attachment of article B" to article C by locking the clip A" into the support member 20 of article B" and the engagement opening 30 of article C, and the process of disengagement; that is, the use of clip structure III for the articles B" and C is shown.

Figure 11:
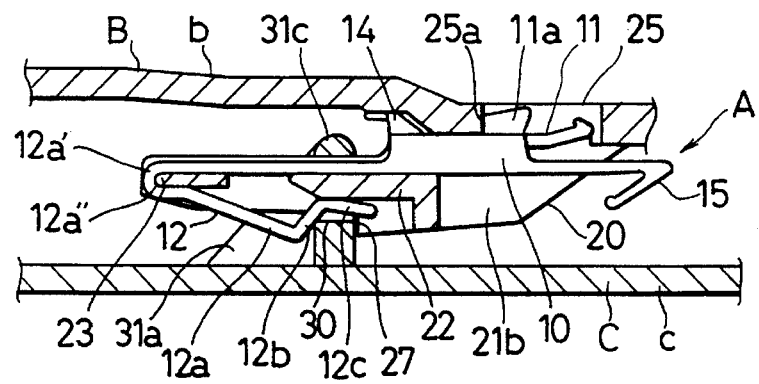
FIG. 11 is a cross-sectional side view showing use of the clip structure of the invention.

Clip A and structure I for affixing articles B and C together using the clip A in accordance with a first embodiment of the invention will now be described, with reference to FIGS. 1 to 15. As shown by FIG. 11, clip A is inserted into the support member 20 provided on the fixing side surface of the article B, and into the opening 30 provided on article C, bringing a resilient engaging portion 12 into engagement with the opening 30, thereby affixing article B to article C. Thus, the structure I for affixing the two articles together is comprised by clip A in association with the support member 20 of article B and the engagement opening 30 of the other article C.

As shown in FIGS. 1 to 5, clip A is comprised of a long, narrow strip-shaped body 10 that includes a resilient tongue 11 on one side, side S, and the resilient engaging portion 12 on the other side, side S'. For imparting the required elastic deformation characteristics to the resilient tongue 11 and resilient engaging portion 12, it is preferable to form the clip A of a plastic or rubber material. The resilient engaging portion 12 is integrally provided at one end of the clip body 10, and includes an inclined portion 12a that is oriented towards the other end of the clip body 10 and slopes down away from the S' side surface of the clip body 10, an engaging portion 12b that continues on from the end of the inclined portion 12a and is bent into a step that rises toward side S' of the clip body 10, and a projecting abutment portion 12c that extends from the end of the engaging portion 12b slightly away from side S'.

The other end of the clip body 10 is provided with a flexible retaining portion 15 angled back toward the opposite end. The retaining portion 15 is formed integrally with the clip body 10, from which it extends at a downward angle, away from the S' side. A rectangular raised portion 13 is formed in the longitudinal center of the S side of the clip body 10. The raised portion 13 has two substantially parallel grooves 13a running lengthwise with respect to the clip body 10. An opening 16 that communicates with the grooves 13a is formed towards the end of the clip body 10 that has the retaining portion 15. The grooves 13a and opening 16 serve to demarcate a slender, resilient tongue 11 from the raised portion 13. The tongue 11 has a small projection at its tip.

The resilient tongue 11 has an integrally formed projection 11a that is located approximately in the center of the tongue 11 and is higher than the raised portion 13. The projection 11a is for engaging with the support member 20. A projection 14 is provided on the raised portion 13 near the root end of the resilient tongue 11. The projection 14 is for positioning the clip A with respect to the support member 20, and for preventing the clip from rattling.

With respect to FIG. 1 and FIGS. 6 to 9, a square opening 25 is formed in the baseplate b of article B. The clip support member 20 is comprised of a pair of opposed sideplates 21a and 21b affixed to the baseplate b along opposite edges of the opening 25, and includes a stop member 22 arranged between the sideplates 21a and 21b to limit flexing of the resilient engaging portion 12. The sideplates 21a and 21b are spaced apart by a sufficient amount to allow the clip A to be inserted therebetween. The sideplates 21a and 21b have narrow portions 21a' and 21b' at the end from which the clip A is inserted. These narrow portions 21a' and 21b' are not in contact with the baseplate b. A support strip 23 is arranged between the narrow portions 21a' and 21b', so that the support strip 23 faces the baseplate b surface. A space 24 separates the support strip 23 from the stop member 22, which also faces the baseplate b surface. The stop member 22 has an integral divider portion 26 that extends down at right-angles to the stop member 22 between wide portions 21a" and 21b" of the sideplates 21a and 21b.

The locking of the clip A to the support member 20 is illustrated by FIG. 10. The clip A is inserted into the support member 20 from the end with the narrow portions 21a' and 21b', retaining portion 15 end first, and with the side S with the raised portion 13 facing the baseplate b surface, so that the other side of the clip body 10, side S', contacts the upper surface of the stop member 22 and support strip 23. In this arrangement, the length of the dimension m between the stop member 22 surface and the baseplate b surface (FIG. 10) is slightly less than the length of the dimension n between the tip of the retaining portion 15 and the tip of the projection 11a (FIG. 2). Therefore, when the clip A is inserted between the sideplates 21a and 21b, as shown by FIG. 10, the projection 11a contacts the baseplate b surface, causing the resilient tongue 11 to flex inwards, while the retaining portion 15 is also flexed inwards by the contact between the stop member 22 and the end of the retaining portion 15. Passing the end of the stop member 22 with the divider 26 allows the resilient tongue 11 and retaining portion 15 to snap back from the flexed position.

As shown in FIG. 11, the projection 11a of the resilient tongue 11 released from the flexed position snaps into engagement with an edge 25a at the side of the opening 25 from which the clip A is inserted. This engagement prevents withdrawal of the inserted clip A. When the clip A is thus inserted between the sideplates 21a and 21b until this engagement is achieved, the contact of the positioning projection 14 against the part of the baseplate b near the opening 25 prevents the clip A from rattling. Also, the support strip 23 is clamped between the inside of the resilient engaging portion 12 and the side S' of the clip body 10, with one edge in contact with the inside of the bend 12a' in the resilient engaging portion 12, and the inside of the abutment portion 12c is in contact with the outer side of the stop member 22. Thus, the abutment of the support strip 23 in the bend 12a' prevents the clip A from being inserted beyond the point of the above engagement.

Article C is then attached to article B, using the clip A inserted into engagement with the support member 20 of article B. For this, article C has an opening 30 for engaging with the resilient portion 12 of clip A. With reference to FIG. 1 and FIGS. 11 to 15, engagement opening 30 is large enough to receive the insertion of the support member 20 with the clip A locked in place. The opening 30 is formed in an upright sideplate 31c disposed between edges on one side of each of a vertical pair of substantially parallel sideplates 31a and 31b. In this arrangement, the height p of the opening 30 (FIG. 12) is slightly less than the dimension s (FIG. 12) from the apex portion 12d between the inclined portion 12a and engaging portion 12b of the resilient engaging portion 12, to the edge of the narrow portion 21a' on the baseplate b side.

Figure 12:
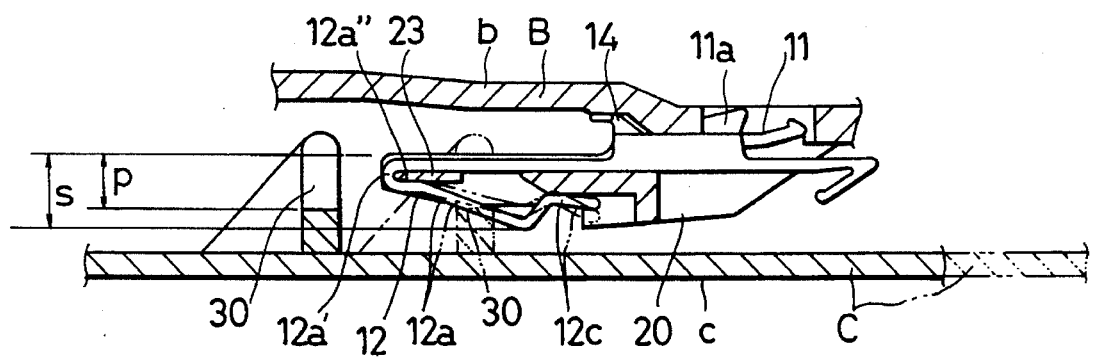
FIG. 12 is a cross-sectional side view showing use of the clip structure of the invention.
Figure 13:
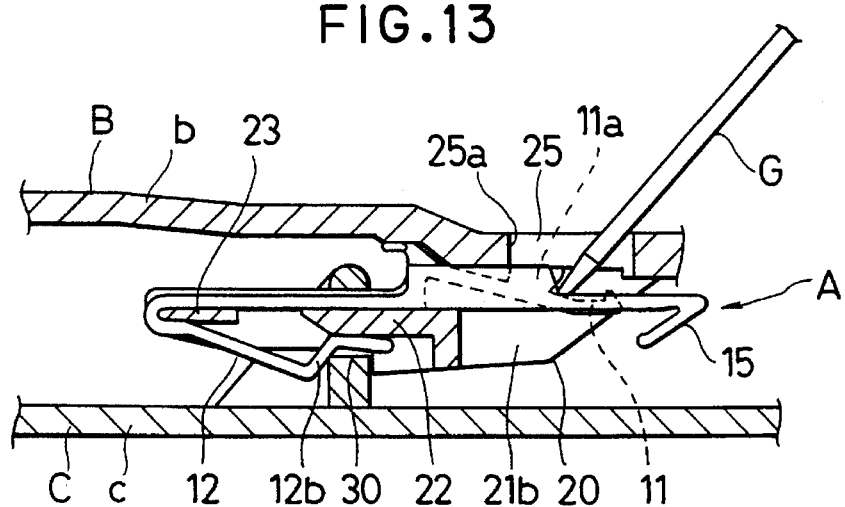
FIG. 13 is a cross-sectional side view showing use of the clip structure of the invention.

To effect engagement between the resilient engaging portion 12 and the opening 30, as shown in FIG. 11, the support member 20 is inserted into the opening 30, starting with the narrow portions 21a' and 21b'. This brings the outer side of the inclined portion 12a into contact with the edge of the hole 30 on the baseplate c side of article C, so that the resilient engaging portion 12 is urged up (as shown in FIG. 12 by the phantom line) while being moved toward the divider 26. Further insertion brings the apex 12d to the edge of the opening 30 on the side opposite to the entry side, at which point the resilience of the engaging portion 12 snaps the outside of the engaging portion 12b into engagement with the edge of the opening 30. This engagement between the engaging portion 12b and the opening 30 locks articles B and C together. With the resilient engaging portion 12 and opening 30 thus locked into engagement, the engagement of the projection 11a with the edge 25a ensures that clip A does not move from its position, even if the support member 20 is pulled in the direction of withdrawal from the opening 30, forcing the engaging portion 12b against the edge of the opening 30. Also, the close contact between the abutment portion 12c of the resilient engaging portion 12 and the stop member 22, between the support strip 23 and the inside of the bend 12a', and between the support strip 23 and baseplate portion 12a" of the abutment portion 12c that is approximately parallel with the side S' of the clip body 10, prevents the clip body 10 from flexing towards side S'. Thus, the articles B and C remain fixed together even when subjected to a pulling force. The sideplates 21a and 21b have a stepped portion 27 between the narrow portions 21a' and 21b' and the wide portions 21a" and 21b". As shown in FIG. 11, the stepped portion 27 is arranged so that it abuts against the edge of the opening 30, thereby preventing the support member 20 from being inserted beyond that point.

Figure 14:
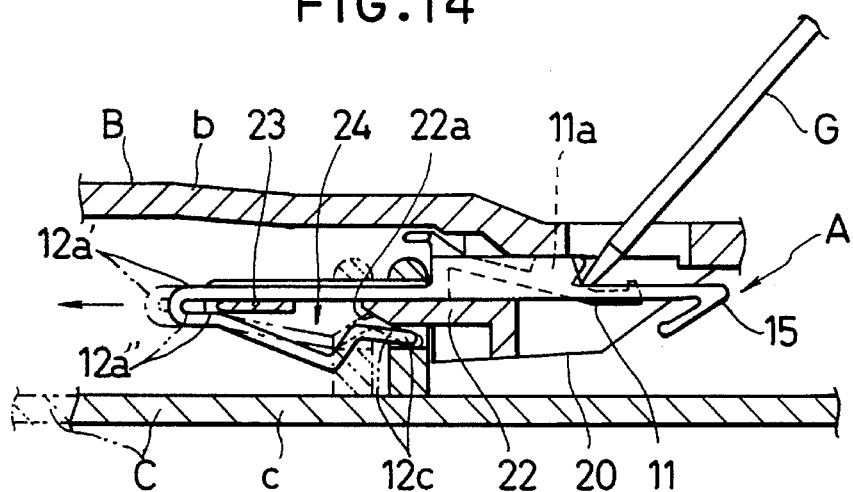
FIG. 14 is a cross-sectional side view showing use of the clip structure of the invention.

The article B is disengaged from the article C by disengaging the projection 11a of the resilient tongue 11 from the edge 25a of the opening 25 in the baseplate b of article B. The resilient tongue 11 is separated from the raised portion 13 by the grooves 13a and associated opening 16. This means that the resilient tongue 11 can be flexed towards side S' of the clip body 10 by pressing down on the resilient tongue 11, thereby enabling the projection 11a to be released from the engaging edge 25a of the opening 25. This can readily be accomplished by inserting a screwdriver or other such suitable tool G into the opening 25 and pressing down on the resilient tongue 11. As shown by FIG. 14, after disengagement, the disengaged state can be maintained by moving the clip A until the projection 11a is at a position of contact with the baseplate b near the opening 25.

Moving article B for disengagement from article C by withdrawing the support member 20 from the opening 30 causes the engaging portion 12b of the resilient engaging portion 12 to abut against the edge of the opening 30. However, with the projection 11a having been disengaged from the engaging edge 25a, the clip A is moved back along the line of insertion until the abutment portion 12c that was in contact with the stop member 22 comes into the space 24 between the stop member 22 and support strip 23. In this arrangement the retaining portion 15 of the clip A projects by an amount that provides contact with the divider 26 on the support member 20. Thus, the clip A cannot be moved further than the point at which the retaining portion 15 comes into contact with the divider 26, thus preventing the clip A from being moved until it falls out of the support member 20.

Figure 15:
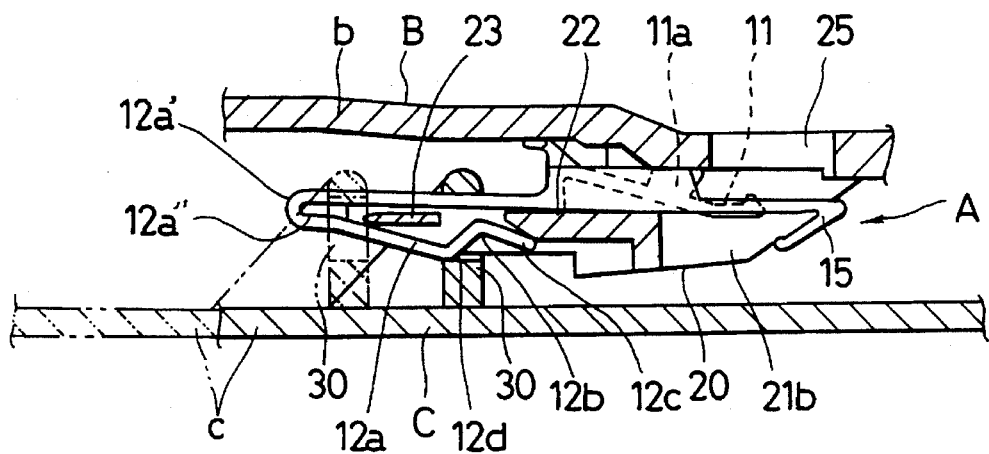
FIG. 15 is a cross-sectional side view showing use of the clip structure of the invention.

When the clip A is thus moved, the inside of the bend 12a' and baseplate portion 12a" shift out of contact with the support strip 23, and the abutment portion 12c enters the space 24. Thus, with the abutment portion 12c being inserted into the space 24, the resilient engaging portion 12 urging the outside of the engaging portion 12b against the opening 30 on article C is flexed in towards side S' of the clip body 10, as shown by the dashed lines in FIG. 14. As shown in FIG. 15, this breaks the engagement between the engaging portion 12b and the opening 30, thereby enabling the support member 20 of article B, together with the attached clip A, to be withdrawn from the opening 30, thereby completing disengagement of articles B and C.

In the case of this arrangement, the edge of the stop member 22 in contact with the space 24 is provided with an inclined surface 22a that starts from the side in contact with the resilient engaging portion 12, and slopes upward to the side in contact with the clip body 10, thus extending the slope towards the support strip 23. During the above disengagement, the inclined surface 22a facilitates the smooth entry of the abutment portion 12c into the space 24.

With reference to FIG. 11, again fastening together articles B and C that have been disengaged can be easily accomplished by inserting clip A into the support member 20 toward the opening 25 until the projection 11a snaps into engagement with the edge 25a, and then inserting the support member 20 into the opening 30.

A clip A' and a structure II for affixing two articles B' and C together using the clip A' according to a second embodiment of the present invention will now be described with reference to FIGS. 16 to 18.

With reference to FIG. 18, clip A' is inserted into the support member 20' provided on the fixing side of article B', and into the opening 30 provided on article C, bringing resilient engaging portion 12' into engagement with the opening 30 and thereby affixing article B' to article C. Thus, the structure II for affixing the two articles together is comprised by clip A' in association with the support member 20' of article B' and the engagement opening 30 of the other article C.

As shown in FIGS. 16 to 18, clip A' is comprised of a long, narrow strip-shaped body 10' that includes a slender, resilient tongue 11' at one end and a resilient engaging portion 12' at the other end. For imparting the required elastic deformation characteristics to the resilient tongue 11' and resilient engaging portion 12', it is preferable to form the clip A' of a plastic or rubber material. The clip body 10' has two substantially parallel grooves 13'a that run lengthwise from the central part of the clip body 10' towards the end where the resilient tongue 11' is located, where there is also an opening 16' that communicates with the grooves 13'a. The grooves 13'a and opening 16' define the resilient tongue 11' with a tip that projects slightly towards side S of the clip body 10'.

In the center of the resilient tongue 11' is an integrally formed engaging projection 11'a that projects up from side S of the clip body 10'. This projection 11'a is for engaging with the support member 20'. A retaining portion 15' is provided at the same end, on the opposite side to the projection 11'a. The resilient engaging portion 12' at the other end of the clip body 10' includes an engaging portion 12'b that projects out at an angle on the opposite side to the resilient tongue 11', and continues into an inclined portion 12'a that slopes at an angle towards an imaginary flat plane that includes the plane of side S of the clip body 10', and an abutment portion 12'c that extends from the end of the inclined portion 12'a, is bent so that the end faces towards the opposite end, and includes a surface that is substantially parallel with the imaginary flat plane that includes the plane of side S of the clip body 10'.

With respect to FIGS. 16 to 18, a square opening 25' is formed in the baseplate b' of article B'. The clip support member 20' is comprised of a pair of opposed sideplates 21'a and 21'b affixed to the baseplate b' along opposite edges of the opening 25'. The sideplates 21'a and 21'b are spaced apart by a sufficient amount to allow the insertion of the clip A'. A stop member 22' is provided that extends between the edges of the sideplates 21'a and 21'b on the baseplate b' side to limit the flexing of the resilient engaging portion 12' when the clip A' is inserted. The sideplates 21'a and 21'b constituting the support member 20' have narrow portions 21'a' and 21'b' at the end from which the clip A' is inserted, arranged so that the narrow portions 21'a' and 21'b' are not in contact with the baseplate b'. A support plate 23' is provided between the narrow portions 21'a' and 21'b' toward the opening 25' to form an arrangement that allows the clip body 10' to be inserted between the opening 25' and the support plate 23'. A divider 26' is integrally affixed to the edge of the stop member 22' facing the narrow portions 21'a' and 21'b'. The divider 26' is at right-angles to the plane of the support plate 23', and extends in the opposite direction to the side on which the stop member 22' is provided.

In this arrangement, the dimension t between the stop member 22' and the support plate 23' (shown in FIG. 17) is slightly less than the dimension u between the tip of the engaging projection 11'a and the tip of the retaining portion 15' (FIG. 17). Therefore, when the clip A' is being inserted, retaining portion 15' end first, between the sideplates 21'a and 21'b, from the end with the narrow portions 21'a' and 21'b', the contact between the projection 11'a and the baseplate b' surface causes the resilient tongue 11' to be flexed inwards, while the retaining portion 15' is also flexed inwards by the contact with the support plate 23'. Further insertion of the clip A' toward the opening 25' allows the resilient tongue 11' and retaining portion 15' to snap back from their flexed states directly below the opening 25'.

As shown in FIG. 17, the engaging projection 11'a of the resilient tongue 11' released from the flexed state snaps into engagement with an edge 25'a of the opening 25' on the side of the opening 25' from which the clip A' is inserted. This engagement prevents withdrawal of the clip A' that has been inserted to that point between the sideplates 21'a and 21'b of the support member 20'. When the clip A' is thus inserted into the support member 20' until the projection 11'a engages with the opening 25', the stop member 22' is sandwiched between the inclined portion 12'a and the abutment portion 12'c, with the front edge pushed into contact with the inside of a bend portion 12'd formed between the inclined portion 12'a and the abutment portion 12'c of the resilient engaging portion 12', and the baseplate portion 12'a' of the inclined portion 12'a, the baseplate portion 12'a' being approximately parallel with side S' of the clip body 10'.

Article C is then attached to article B', using the clip A' inserted into engagement with the support member 20' of article B'. For this, article C has an opening 30 for engaging with the resilient portion 12' of clip A'. The arrangement of the article C that includes the opening 30 is substantially identical to that in the first embodiment. Therefore, parts that are the same as those in the first embodiment have been given the same reference symbols, and further explanation thereof is omitted.

In this arrangement, the height p of the opening 30 (FIG. 16) is slightly less than the dimension w (FIG. 16) from the apex portion 12'e between the inclined portion 12'a and the engaging portion 12'b of the resilient engaging portion 12', to the abutment portion 12'c. With the clip A' in position in the support member 20' of the article B', to effect engagement between the resilient engaging portion 12' of the clip A' and the opening 30, the support member 20' is inserted into the opening 30, starting with the narrow portions 21'a' and 21'b'. This brings the outer side of the inclined portion 12'a into contact with the edge of the opening 30 on the baseplate c side, whereby the resilient engaging portion 12' is urged upward while being moved toward the divider 26'. Further insertion brings the apex 12'e to the edge of the opening 30 on the side opposite to the entry side, at which point, as shown in FIG. 18, the resilience of the engaging portion 12' snaps the outside surface of the engaging portion 12'b into engagement with the edge of the opening 30, locking together articles B' and C.

With the resilient portion 12' thus engaged with the opening 30, the engagement between the projection 11'a and the opening 25' ensures that clip A' is not moved from its position, even if the support member 20' is pulled in the direction of withdrawal from the opening 30, forcing the engaging portion 12'b against the edge of the opening 30. The resilient engaging portion 12' cannot flex in, since the stop member 22' is pushed into contact with the inside of the bend portion 12'd on the resilient engaging portion 12', where it is also sandwiched between the baseplate portion 12'a' and the abutment portion 12'c. As a result, the articles B' and C remain fixed together even when subjected to a pulling force.

The article B' can be disengaged from the article C by disengaging the clip projection 11'a on the resilient tongue 11' from the edge 25'a of the opening 25' in the baseplate b' of article B'. The presence of the grooves 13'a and associated opening 16' allows the resilient tongue 11' to be flexed towards side S' of the clip body 10' by pressing the resilient tongue 11' down towards the side S', which enables the projection 11'a to be released from the engaging edge 25'a of the opening 25'. This can readily be accomplished by inserting a screwdriver or other such suitable tool to press down on the resilient tongue 11' via the opening 25'. Following disengagement, the disengaged state can be maintained by moving the clip A' until the projection 11'a comes into contact with the baseplate b' surface near the opening 25'.

Moving the support member 20' of article B' to withdraw the support member 20' from the opening 30 causes the engaging portion 12'b of the resilient engaging portion 12' to abut against the edge of the opening 30. However, with the projection 11'a having been disengaged from the edge 25'a, the clip A' is moved back along the line of insertion to a point at which a space has been opened up between the edge of the stop member 22' and the inside surface of the bend portion 12'd, and although the abutment portion 12'c is in contact with the top of the stop member 22', the baseplate portion 12'a' of the inclined portion 12'a is not in contact with the stop member 22'. When the clip A' is thus shifted, the resilient engaging portion 12' that urges the engaging portion 12'b against the opening 30 on article C is flexed towards article B', as shown by the dashed lines in FIG. 18.

In this arrangement the retaining portion 15' of the clip A' projects by an amount that provides contact with the support plate 23' on the support member 20' Thus, the clip A' cannot be moved beyond the point at which the retaining portion 15' comes into contact with the support plate 23', thus preventing the clip A' from being moved until it falls out of the support member 20'. As shown in FIG. 18, the flexing of the portion 12' breaks the engagement between the engaging portion 12'b and the opening 30, thereby enabling the support member 20' of article B', together with the attached clip A', to be withdrawn from the opening 30, thereby completing disengagement of articles B' and C. With reference to FIG. 17, refastening articles B' and C that have been disengaged can be easily accomplished by inserting clip A' into the support member 20' toward the opening 25' until the projection 11'a snaps into engagement with the edge 25'a, and then inserting the support member 20' into the opening 30.

A clip A" and a structure III for affixing two articles B" and C together using the clip A" according to a third embodiment of the present invention will now be described with reference to FIGS. 19 to 21.

With reference to FIG. 20, clip A" is inserted into the support member 20" provided on the fixing side of article B", and into the opening 30 provided on article C, bringing resilient engaging portion 12" into engagement with the opening 30 and thereby affixing article B" to article C. Thus, the structure III for affixing the two articles together is comprised by clip A" in association with the support member 20" of article B" and the engagement opening 30 of the other article C.

As shown in FIGS. 19 to 21, clip A" is comprised of a long, narrow strip-shaped body 10" that includes a slender, resilient tongue 11" at one end and a resilient engaging portion 12" at the other end. For imparting the required elastic deformation characteristics to the resilient tongue 11" and resilient engaging portion 12", it is preferable to form the clip A" of a plastic or rubber material. The clip body 10" has two substantially parallel grooves 13"a that run lengthwise from the central part of the clip body 10" towards the end where the resilient tongue 11" is located, where there is also an opening 16" that communicates with the grooves 13"a. The grooves 13"a and opening 16" define the resilient tongue 11" with a tip that projects slightly towards side S of the clip body 10".

In the center of the resilient tongue 11" is an integrally formed engaging projection 11"a that projects up from side S of the clip body 10". This projection 11"a is for engaging with the support member 20". A retaining portion 15" is provided at the same end, on the opposite side to the projection 11"a. The resilient engaging portion 12" at the other end of the clip body 10" includes an engaging portion 12"b that projects out at an angle on the opposite side to the resilient tongue 11", and continues into an inclined portion 12"a that slopes at an angle towards an imaginary flat plane that includes the plane of side S of the clip body 10", and an abutment portion 12"c that extends from the end of the inclined portion 12"a, is bent so that the end faces towards the opposite end, and includes a surface that is substantially parallel with the imaginary flat plane that includes the plane of side S of the clip body 10". A strip 10"a that is thinner than the clip body 10" extends from the same end of the clip body 10" as the engaging portion 12", so that the end of the strip 10"a is opposite the end of the abutment portion 12"c.

With respect to FIGS. 20 and 21, a square opening 25" is formed in the baseplate b" of article B". The clip support member 20" is comprised of a pair of opposed sideplates 21"a and 21"b affixed to the baseplate b" along opposite edges of the opening 25". The sideplates 21"a and 21"b are spaced apart by a sufficient amount to allow the insertion of the clip A". The sideplates 21"a and 21"b constituting the support member 20" have narrow portions 21"a' and 21"b' at the end from which the clip A" is inserted, arranged so that the narrow portions 21"a' and 21"b' are not in contact with the baseplate b". A support plate 23" is provided between the sideplates 21"a and 21"b toward the opening 25" to form an arrangement that allows the clip body 10" to be inserted between the opening 25" and the support plate 23". The edge of the support plate 23" on the side with the narrow portions 21"a' and 21"b' is provided with a slender stop member 22" that extends towards the front ends of the narrow portions 21"a' and 21"b'. A divider 26" is integrally affixed to the edge of the stop member 22" on the side with the narrow portions 21"a' and 21"b. The divider 26" is at right-angles to the surface of the support plate 23".

In this arrangement, the dimension x from the support plate 23" to the baseplate b" (shown in FIG. 20) is slightly less than the dimension y from the top of the engaging projection 11"a tip to the tip of the retaining portion 15" (FIG. 20). Therefore, when the clip A" is being inserted, retaining portion 15" end first, between the sideplates 21"a and 21"b, from the end with the narrow portions 21"a' and 21"b', the contact between the projection 11"a and the baseplate b" surface causes the resilient tongue 11" to be flexed inwards, while the retaining portion 15" is also flexed inwards by the contact with the support plate 23". Further insertion of the clip A" toward the opening 25" allows the resilient tongue 11" and retaining portion 15" to snap back from their flexed states directly below the opening 25".

In this arrangement, as shown in FIG. 20, the engaging projection 11"a of the resilient tongue 11" released from the flexed state snaps into engagement with an edge 25"a of the opening 25" on the side of the opening 25" from which the clip A" is inserted. This engagement prevents withdrawal of the clip A" that has been inserted to that point between the sideplates 21"a and 21"b of the support member 20". The stop member 22" can be inserted into an aperture 12"f formed in the engaging portion 12"b. When the clip A" is thus inserted into the support member 20" until the projection 11"a engages with the opening 25", the end of the stop member 22" is sandwiched between the baseplate portion 12"a' of the inclined portion 12"a and the abutment portion 12"c, with the front edge in contact with the inside of a bend portion 12"d formed between the inclined portion 12"a and abutment portion 12"c of the resilient engaging portion 12", and the baseplate portion 12"a' of the inclined portion 12"a, the baseplate portion 12"a' being approximately parallel with side S' of the clip body 10". A projection 12"g is formed on the abutment portion 12"c. The projection 12"g projects towards the inclined portion 12"a, and is for engagement in a hole 22"a formed at the end of the stop member 22".

Article C is then attached to article B", using the clip A" inserted into engagement with the support member 20" of article B". For this, article C has an opening 30 for engaging with the resilient portion 12" of clip A". The arrangement of the article C that includes the opening 30 is substantially identical to that in the first embodiment. Therefore, parts that are the same as those in the first embodiment have been given the same reference symbols, and further explanation thereof is omitted.

In this arrangement, the height p of the opening 30 (FIG. 19) is slightly less than the dimension z (FIG. 19) from the apex portion 12"e between the inclined portion 12"a and the engaging portion 12"b of the resilient engaging portion 12", to the strip 10"a. Thus, with the clip A" in position in the support member 20" of the article B", to effect engagement between the resilient engaging portion 12" of the clip A" and the opening 30, the support member 20" is inserted into the opening 30, starting with the narrow portions 21"a' and 21"b'. This brings the outer surface of the inclined portion 12"*a* into contact with the lower edge of the hole 30, whereby the resilient engaging portion 12" is flexed inwardly while being moved toward the divider 26". Further insertion brings the apex 12"*e* to the edge of the opening 30 on the side opposite to the entry side, at which point, as shown in FIG. 21, the resilience of the engaging portion 12" snaps the outside surface of the engaging portion 12"*b* into engagement with the edge of the opening 30, locking together articles B" and C.

With the resilient portion 12" thus engaged in the opening 30, the engagement between the projection 11"*a* and the opening 25" ensures that clip A" is not moved from its position, even if the support member 20" is pulled in the direction of withdrawal from the opening 30, forcing the engaging portion 12"*b* against the edge of the opening 30. Moreover, the resilient engaging portion 12" is prevented from flexing by the stop member 22" being sandwiched between the baseplate portion 12"*a'* and the abutment portion 12"*c*. As a result, the articles B" and C remain fixed together even when subjected to a pulling force.

The article B" can be removed from the article C by disengaging the clip projection 11"*a* on the resilient tongue 11" from the edge 25"*a* of the opening 25" in the baseplate b" of article B". The presence of the grooves 13"*a* and associated opening 16" allows the resilient tongue 11" to be flexed towards the surface of the clip body 10" by pressing the resilient tongue 11" down towards the surface, which enables the projection 11"*a* to be released from the engaging edge 25"*a* of the opening, as shown in FIG. 21. This can readily be accomplished by inserting a screwdriver or other such suitable tool to press down on the resilient tongue 11" via the opening 25". Following disengagement, the disengaged state can be maintained by moving the clip A" until the projection 11"*a* comes into contact with the baseplate b" surface near the opening 25".

Moving the support member 20" of article B" to withdraw the support member 20" from the opening 30 causes the engaging portion 12"*b* of the resilient engaging portion 12" to abut against the edge of the opening 30. However, since the projection 11"*a* has been disengaged from the edge 25"*a*, moving the clip A" back along the line of insertion disengages the projection 12"*g* from the hole 22"*a* and withdraws the stop member 22" from between the baseplate portion 12"*a'* and the abutment portion 12"*c*. When the clip A" is thus moved, the resilient engaging portion 12" that urges the engaging portion 12"*b* against the edge of the opening 30 in article C is flexed towards article B", as shown by the dashed lines in FIG. 21.

In this arrangement the retaining portion 15" of the clip A" projects by an amount that provides contact with the support plate 23" on the support member 20" Thus, the clip A" cannot be moved beyond the point at which the retaining portion 15" comes into contact with the support plate 23", thus preventing the clip A" from being moved until it falls out of the support member 20". As shown in FIG. 21, the flexing of the engaging portion 12" breaks the engagement between the portion 12"*b* and the opening 30, thereby enabling the support member 20" of article B", together with the attached clip A", to be withdrawn from the opening 30, thereby completing disengagement of articles B" and C. With reference to FIG. 20, refastening articles B" and C that have been disengaged can easily be accomplished by inserting the clip A" into the support member 20" toward the opening 25" until the projection 11"*a* snaps into engagement with the edge 25"*a*, and then inserting the support member 20" into the opening 30.

As described in the foregoing, the clip according to this invention includes a resilient tongue at one end and a resilient engaging portion at the other, and a means for enabling the resilient tongue to slip into engagement in a support member provided on one article to allow that article to be attached to another article. Also, the support member is provided with a stop member which is in contact with the resilient engaging portion when the resilient tongue is engaged with the support member, thereby preventing the resilient engaging portion from being flexed. Moreover, the lock on the flexing by the resilient engaging portion can be released by disengaging the engaging means on the tongue and moving the clip. Thus, the clip can be affixed to an article to be attached to another article by the engagement of the resilient tongue in the support member of the article, allowing the article to be attached in a single action, and also allowing the article to be readily replaced.

When thus affixed, the resilient engaging portion is held in contact with the stop member that prevents flexing by the resilient engaging portion. This enables the resilient engaging portion to be attached to a part of an article to which another article can then be attached. The article can also be detached by pressing down the resilient tongue, releasing the engagement between the resilient tongue and the support member and thereby enabling the clip to be moved. When the clip is moved, the resilient engaging portion can be flexed, allowing it to be disengaged from the part of the article. Since the resilient tongue is separate from the resilient engaging portion, the amount by which the resilient tongue is flexed for disengagement can be minimized, and the amount of elastic deformation by the resilient engaging portion for secure engagement with the receiving article can be increased, and a high degree of stiffness can be imparted.

The invention also provides a clip structure for affixing a pair of articles together, using the above clip with a resilient tongue at one end of the clip and a resilient engaging portion at the other end. Again, the resilient tongue is provided with means that allow it to be engaged with a support member on one article, and the support member has a stop member to stop the resilient engaging portion from flexing when the engaging portion of the resilient tongue is in engagement with the support member. The resilient engaging portion is inserted into engagement with an opening on the other article when flexing by the resilient engaging portion is blocked, and disengaged when the resilient engaging portion is free to flex. Thus, the clip is affixed to the article by the resilient tongue means snapping into engagement with the support member, enabling the article to then be attached to the other article with a single action, and also facilitating replacement of the article thus attached.

When thus affixed, the resilient engaging portion is held in contact with the stop member that prevents flexing by the resilient engaging portion. This enables the resilient engaging portion to be attached to one article to which another article can then be attached in a single action.

To release the engagement between the two articles, the resilient tongue is pressed down, which releases it from the support member and enables the clip to be moved. Moving the clip allows the resilient engaging portion to be flexed, enabling the resilient engaging portion to be withdrawn from engagement in the opening of the other article.

Since the resilient tongue is separate from the resilient engaging portion, the amount by which the resilient tongue is flexed for disengagement can be minimized, and the amount of elastic deformation by the resilient engaging portion for secure engagement with the receiving article can be increased, and a high degree of stiffness can be imparted.

Thus, it is easy to disengage a pair of articles that have been attached together with the clip, and this disengagement can be repeated multiple times without any loss of the original function capability of the clip.

The above clip structure for attaching two articles together also includes an opening on the article to be attached, in which the resilient tongue engages. Disengagement can be accomplished by flexing the resilient tongue via the opening. After disengagement, the disengaged state can be maintained by moving the clip until the engagement projection is contacting the article. Thus, it is easy to disengage two articles that have been locked together by the clip.

Obviously, numerous modifications and variations of the present invention are possible in light of the above teachings. It is therefore to be understood that within the scope of the appended claims, the invention may be practiced otherwise than as specifically described herein.

What is claimed is:

1. A clip adapted to be incorporated into a first article having a support member equipped with a stop member fastening the support member of the first article to a second article having an opening, said clip comprising:

a resilient tongue located at one end of said clip, said tongue being provided with an engaging portion adapted to engage the support member of the first article; and a resilient engaging portion located at another end of said clip and resilient engaging portion is prevented from flexing when adapted for engagement with the support member of the first article, said resilient engaging portion is adapted to be in contact with the stop member, when the engaging portion of the resilient tongue is adapted to be in engagement with the support member, so as to be prevented from flexing and for engagement with the opening of the second article wherein when the engaging portion is disengaged from the stop member and said clip is moved, the engaging portion is out of contact with the stop member and is permitted to flex.

2. A combination of a clip, a first article and a second article, said first article having a window opening and a support member equipped with a stop member;

said second article having an opening;

said clip fastening said support member of said first article to said second article, said combination comprises:

a resilient tongue located at one end of said clip and being provided with an engaging portion engageable with the support member of the first article; and a resilient engaging portion located at another end of said clip, said resilient engaging portion contacting with said stop member, when said engaging portion of said resilient tongue is in engagement with said window opening of said support member, and being prevented from flexing and engaging with said opening of said second article wherein when said engaging portion is disengaged from said stop member and said clip is moved, said engaging portion is out of contact with said stop member and is permitted to flex, thereby enabling said support member of said first article to be separated from said second article.

* * * * *